United States Patent
Deng et al.

(10) Patent No.: US 7,671,689 B2
(45) Date of Patent: Mar. 2, 2010

(54) TRANSISTOR VOLTAGE CONTROLLED OSCILLATOR

(75) Inventors: Ping-Yuan Deng, Taipei (TW); Jean-Fu Kiang, Taipei (TW)

(73) Assignee: National Taiwan University, Taipei (TW)

(*) Notice: Subject to any disclaimer, the term of this patent is extended or adjusted under 35 U.S.C. 154(b) by 8 days.

(21) Appl. No.: 12/048,558

(22) Filed: Mar. 14, 2008

(65) Prior Publication Data
US 2009/0128244 A1   May 21, 2009

(30) Foreign Application Priority Data
Nov. 15, 2007   (TW) ............... 96143169 A

(51) Int. Cl.
*H03B 5/08* (2006.01)
(52) U.S. Cl. ............. 331/167; 331/117 R; 331/117 FE; 331/177 R
(58) Field of Classification Search ............. 331/167, 331/175, 177 R, 117 R, 117 FE; 330/52
See application file for complete search history.

(56) References Cited

U.S. PATENT DOCUMENTS 6,621,331 B2 * 9/2003 Pobanz et al. ............. 327/568
2004/0066236 A1 * 4/2004 Fujimoto et al. ........... 330/302
2006/0197621 A1 * 9/2006 Jeon et al. .................. 331/167

* cited by examiner

*Primary Examiner*—Joseph Chang
*Assistant Examiner*—Jeffrey Shin
(74) *Attorney, Agent, or Firm*—Pearne & Gordon LLP

(57) ABSTRACT

A FET transistor voltage-controlled oscillator is provided that includes a crossed-coupled inductor capacitor tank (LC-Tank) transistor voltage-controlled circuit having a first transistor and a second transistor, as well as a transistor frequency multiplying circuit having a third transistor and a fourth transistor. In the design, the gate of the first transistor is connected to the drain of the second transistor, and the gate of the second transistor is connected to the drain of the first transistor. Then, the source of the third transistor is connected to the source of the first transistor, and the source of the fourth transistor is connected to the source of the second transistor. Last, the gate of the third transistor is connected to the gate of the fourth transistor, and the drain of the third transistor is connected to the drain of the fourth transistor. Therefore, the parasitic capacitance present in the first transistor and the parasitic capacitance present in the second transistor generate an effect similar to two capacitors connected in series, via the transistor frequency multiplying circuit. The effect reduces the total capacitance of the voltage-controlled oscillator, to increase the working frequency of the voltage-controlled circuit and allow a circuit having the voltage-controlled circuit to operate at a high frequency.

16 Claims, 4 Drawing Sheets

TRANSISTOR VOLTAGE CONTROLLED OSCILLATOR

BACKGROUND OF THE INVENTION

1. Field of the Invention

This invention relates to oscillators, and more particularly, to a FET transistor voltage-controlled oscillator.

2. Description of Related Art

A metal-oxide-semiconductor field-effect transistor (MOSFET) is a type of FET widely applied in electronic circuits. Typically, a MOSFET comprises three terminals, a gate G, a source S, and a drain D, wherein the gate is formed by stacking a metal layer, an oxide layer and a semiconductor layer sequentially and has a structure similar to a capacitor.

The conduction efficiency of the FET relates to the capacitance of the gate oxide layer of the FET. With the rapid development of modern semiconductor technology, the size of a FET has become smaller and smaller, and the gate oxide layer of a FET has become smaller and thinner. Further, because conducted electrons move along a channel at an interface between the oxide layer and the semiconductor bulk when the FET is turned on, the interface between the oxide layer and the semiconductor bulk has to be fabricated as smooth as possible. Moreover, since the substrate of a semiconductor has low resistance, parasitic capacitance is exhibited in the smooth interface, the low-resistance substrate and around the metal conductors connecting these transistors during operation, affecting the working efficiency of the FET.

This so-called parasitic capacitance is a slight capacitance not designed in on purpose but existing between the conductive traces and the silicon substrate of an integrated circuit. Under a low oscillation frequency condition, this parasitic capacitance effect is not significant and can be neglected. However, the higher the oscillation frequency is, the more significant the parasitic capacitance effect becomes and, thus, can no longer be neglected during design.

Referring to FIG. 1, a conventional inductor-capacitor tank transistor voltage-controlled circuit is shown. The inductor-capacitor tank transistor voltage-controlled circuit comprises a pair of crossed-coupled transistors, a pair of inductors L and a pair of varactors C. In operation, an external voltage source $V_{DD}$ supplies power for the switching mechanism of the gates of the crossed-coupled transistors and provides a working voltage to the transistor voltage-controlled circuit, the inductors L and the varactors C of the inductor-capacitor tank transistor voltage-controlled circuit to determine the oscillation frequency of the circuit.

However, as the oscillation frequency becomes higher and higher, the parasitic capacitance effect is too significant to be neglected. It can be viewed from node 11 or node 12, as shown in FIG. 1, that the conventional inductor-capacitor tank transistor voltage-controlled circuit has a significant parasitic capacitance effect. Since the working frequency of an LC oscillator is inversely proportional to the square root of the total capacitance of the LC oscillator, i.e., $$f = \frac{1}{2\pi\sqrt{LC}},$$

the actual working frequency of the inductor-capacitor tank transistor voltage-controlled circuit is reduced by about 30%~40% due to the parasitic capacitance effect.

Therefore, a definite need exists in the art to provide a voltage-controlled oscillator that can reduce the parasitic capacitance effect when operating at high frequency to increase the working frequency of the voltage-controlled circuit.

SUMMARY OF THE INVENTION

In view of the above-mentioned problems of the prior art, it is a primary objective of the present invention to provide a voltage-controlled oscillator that reduces the parasitic capacitance effect when operating at a high frequency, in order to prevent the decrease of the oscillator frequency of the inductor-capacitor tank transistor oscillation circuit and increase the working frequency of the voltage-controlled circuit.

To achieve the above-mentioned and other objectives, the transistor voltage-controlled oscillator includes a crossed-coupled inductor-capacitor tank (LC-Tank) transistor voltage-controlled circuit including a first transistor having a first gate, a first source and a first drain, and a second transistor having a second gate, a second source and a second drain; and a transistor frequency multiplying circuit including a third transistor having a third gate, a third source and a third drain, and a fourth transistor having a fourth gate, a fourth source and fourth drain, wherein the third gate is connected to the fourth gate, the third drain is connected to the fourth drain, the third source is connected to the first source, and the fourth source is connected to the second source.

The crossed-coupled inductor-capacitor tank transistor voltage-controlled circuit further includes a first varactor, a second varactor, a first inductive circuit and a second inductive circuit, the first varactor having a first capacitor end and a second capacitor end, the second varactor having a third capacitor end and a fourth capacitor end, the first inductive circuit having a first inductor end and a second inductor end, the second inductive circuit having a third inductor end and a fourth inductor end.

The second capacitor end is connected to the third capacitor end, the first capacitor end is connected to the first inductor end, and the fourth capacitor end is connected to the third inductor end. The first drain is connected to the second gate and the first capacitor end, and the second drain is connected to the first gate and the fourth capacitor end.

Regarding the power supplies, the second inductor end and the fourth inductor end are connected to a working voltage source, which is used as the working voltage of the oscillator and is used for modulating the working states of the first transistor and the second transistor. The third gate and the fourth gate are connected to a modulation voltage source for operating the working states of the third transistor and the fourth transistor.

The third source is connected to an external current source, and the fourth source is connected to another external current source. The external current sources adjust working bias voltages of the transistor voltage-controlled oscillator of the present invention and stabilize the operation of the transistor voltage-controlled oscillator.

Compared with the prior art, the transistor voltage-controlled oscillator of the present invention includes the transistor frequency multiplying circuit having a third transistor and a fourth transistor, in addition to a crossed-coupled inductor-capacitor tank (LC-Tank) transistor voltage-controlled circuit having a first transistor and a second transistor. In the design, the gate of the first transistor is connected to the drain of the second transistor, and the gate of the second transistor is connected to the drain of the first transistor. Then, the source of the third transistor is connected to the source of the first transistor, and the source of the fourth transistor is connected to the source of the second transistor. Last, the gate of the third transistor is connected to the gate of the fourth transistor, and the drain of the third transistor is connected to the drain of the fourth transistor. With this design, parasitic capacitance existing in the first transistor and parasitic capacitance existing in the second transistor combine in a way similar to two capacitors connected in series, via the transistor frequency multiplying circuit.

In summary, the present invention discloses a transistor voltage-controlled oscillator that can operate at high frequency, reduce the parasitic capacitance effect, prevent the decrease of the oscillation frequency of an inductor-capacitor tank transistor oscillator, increase the working frequency of the voltage-controlled circuit, and allow a circuit having the voltage-controlled circuit to operate at a high frequency.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be readily understood by those skilled in the art after reading the disclosure of this specification. The present invention can also be performed or applied by other differing embodiments. The details of the specification may be changed on the basis of different points and applications, and numerous modifications and variations can be devised without departing from the spirit of the present invention.

Figure 1:
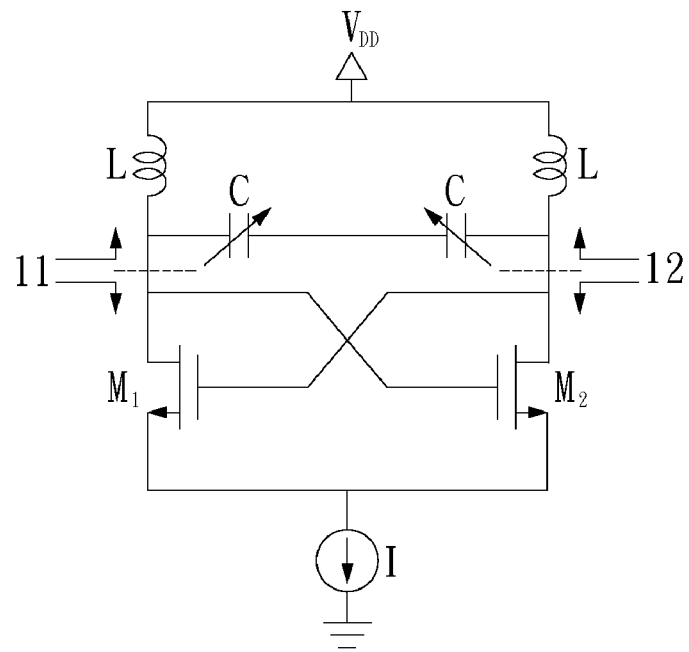
FIG. 1 is a circuit diagram of a conventional inductor-capacitor tank transistor voltage-controlled circuit.
Figure 2:
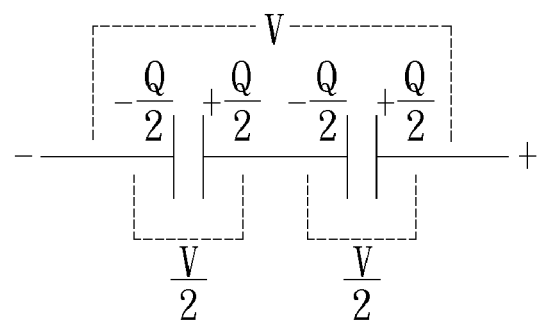
FIG. 2 is a circuit diagram showing two capacitors connected in series under the same voltage.

Referring to FIG. 2, a circuit diagram with two capacitors connected in series under the same voltage V is shown, wherein the two capacitors have the same capacitance C. For the capacitance of a capacitor in general, C is defined by:

$$C = \frac{Q}{V},$$

where V is the voltage difference between the two ends of the capacitor, and Q is the amount of charge stored in the capacitor. As shown in FIG. 2, one capacitor is connected in series with another capacitor to form a series capacitor set, wherein a voltage V is applied across the two ends of the series capacitor set, to provide a voltage equal to V/2 to the two ends of each of the two capacitors, and accumulate charges having amounts equal of Q/2 and −Q/2 on the two plates of each of the two capacitors, respectively. Since the adjacent Q/2 and −Q/2 accumulated charges neutralize, the total capacitance of the series capacitor set, as seen externally, is reduced to C/2.

Since the external voltage is V, and the total capacitance of the series capacitor set is reduced from an original capacitance 2C to C/2, the total capacitance of the series capacitor set is reduced to one fourth of the original total capacitance if the capacitors were independent. Further, since the oscillation frequency of the inductor-capacitor tank transistor voltage-controlled circuit is defined by:

$$f = \frac{1}{2\pi\sqrt{LC}},$$

it is known from the introduction of one fourth of the original capacitance into the above equation that the oscillation frequency of the transistor voltage-controlled circuit is doubled by connecting one capacitor in series with another capacitor to form a series structure.

The First Embodiment

Figure 3:
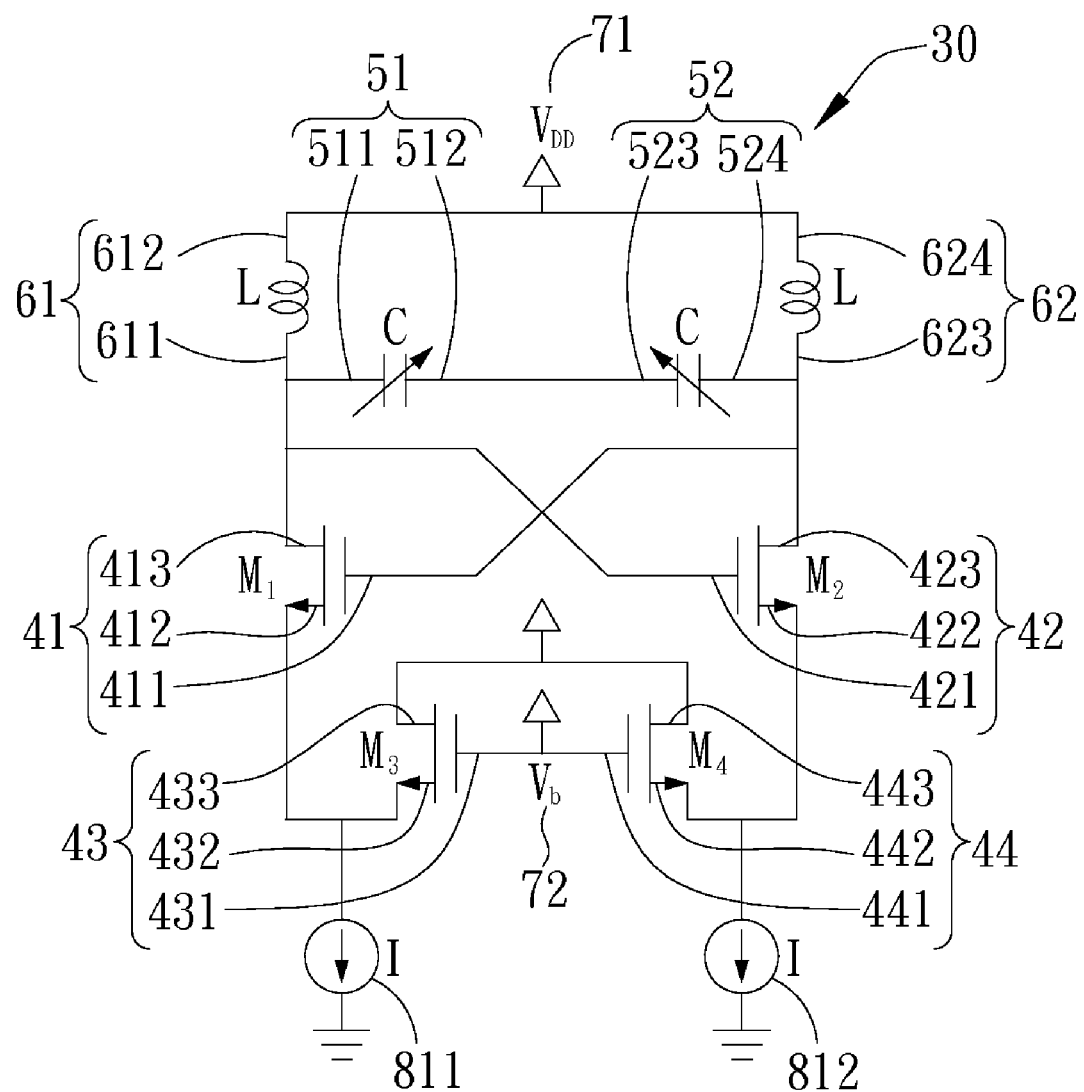
FIG. 3 is a circuit diagram of a transistor voltage-controlled oscillator of a first embodiment according to the present invention.

FIG. 3 is a circuit diagram of a transistor voltage-controlled oscillator 30 of a first embodiment according to the present invention. The transistor voltage controlled oscillator 30 comprises a crossed-coupled inductor-capacitor tank transistor voltage-controlled circuit and a transistor frequency multiplying circuit. The crossed-coupled inductor-capacitor tank transistor voltage-controlled circuit comprises a first transistor 41 and a second transistor 42, the first transistor 41 having a first gate 411, a first source 412 and a first drain 413, the second transistor 42 having a second gate 421, a second source 422 and a second drain 423. The transistor frequency multiplying circuit comprises a third transistor 43 and a fourth transistor 44, the third transistor 43 having a third gate 431, a third source 432 and a third drain 433, the fourth transistor 44 having a fourth gate 441, a fourth source 442 and a fourth drain 443.

The third gate 431 is connected to the fourth gate 441, the third drain 433 is connected to the fourth drain 443, the third source 432 is connected to the first source 412, the fourth source 442 is connected to the second source 422, the first gate 411 is connected to the second drain 423, and the second gate 421 is connected to the first drain 413.

The transistor voltage-controlled circuit 30 further comprises a first varactor 51, a second varactor 52, as well as a first inductive circuit 61 and a second inductive circuit 62. The first varactor 51 includes a first capacitor end 511 and a second capacitor end 512. The second varactor 52 includes a third capacitor end 523 and a fourth capacitor end 524. The first inductive circuit 61 includes a first inductor end 611 and a second inductor end 612. The second inductive circuit 62 includes a third inductor end 623 and a fourth inductor end 624.

The second capacitor end 512 is connected to the third capacitor end 523, the first capacitor end 511 is connected to the first inductor end 611, and the fourth capacitor end 524 is connected to the third inductor end 623. The first drain 413 is connected to the second gate 421 and the first capacitor end 511 (along with the first inductor end 611), and the second drain 423 is connected to the first gate 411 and the fourth capacitor end 524 (along with the second inductor end 623).

Regarding the power supplies, the second inductor end 612 and the fourth inductor end 624 are connected to a working voltage source $V_{DD}$ 71, which provides the working voltage of the transistor voltage-controlled oscillator 30 and modulates the working states of the first transistor 41 and the second transistor 42. The third gate 431 and the fourth gate 441 are connected to a modulation voltage source 72, which modulates the working states of the third transistor 43 and the fourth transistor 44.

The third source 432 and the fourth source 442 are connected to external current sources 811 and 812, respectively. The external current sources 811 and 812 modulate the working biased voltage for the transistor voltage-controlled oscillator 30, so as to stabilize the operation of the transistor voltage-controlled oscillator 30.

The transistor voltage-controlled oscillator 30 of the present invention is fabricated by having the crossed-coupled inductor-capacitor tank transistor voltage-controlled circuit, which includes the first transistor 41 and the second transistor 42, to work with the transistor frequency multiplying circuit, which includes the third transistor 43 and the fourth transistor 44. First, the gate 411 of the first transistor is connected to the drain of the second transistor 423, and the gate 421 of the second transistor is connected to the drain 413 of the first transistor. Then, the source 432 of the third transistor is connected to the source 412 of the first transistor, and the source 442 of the fourth transistor is connected to the source 422 of the second transistor. Last, the gate 431 of the third transistor is connected to the gate 441 of the fourth transistor, and the drain 433 of the third transistor is connected to the drain 443 of the fourth transistor.

Therefore, the parasitic capacitance in the first transistor 41 and the parasitic capacitance in the second transistor 42 combine to produce an effect similar to two capacitors connected in series, via the transistor frequency multiplying circuit, and form a series structure, to consequently double the oscillation frequency of the transistor voltage controlled circuit 30.

In conclusion, the transistor voltage-controlled oscillator 30 can reduce the parasitic capacitance effect when operating at high frequency to prevent the decrease of the oscillation frequency of the inductor-capacitor tank transistor oscillator, increase the working frequency of the voltage-controlled circuit, and allow a circuit having the voltage-controlled circuit to operate at high frequency.

The Second Embodiment

Figure 4:
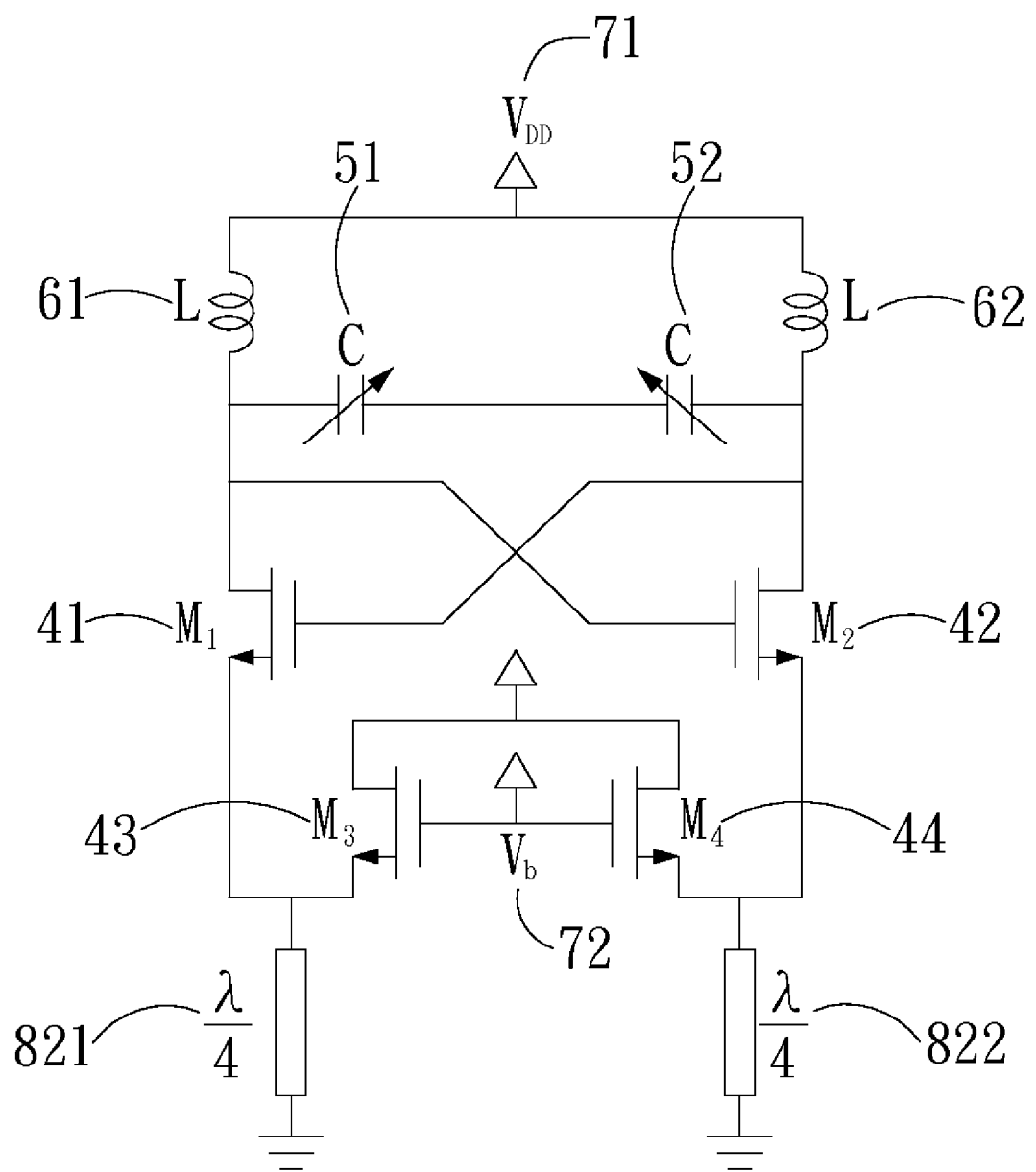
FIG. 4 is a circuit diagram of a transistor voltage-controlled oscillator of a second embodiment according to the present invention.

FIG. 4 is a circuit diagram of the transistor voltage-controlled oscillator of a second embodiment according to the present invention. In the second embodiment, two transmission lines 821 and 822, each having a length equal to one-fourth the wavelength of operation, are used to replace the external current sources 811 and 812, respectively, to provide high resistance and reduce the parasitic capacitance effect.

The Third Embodiment

Figure 5:
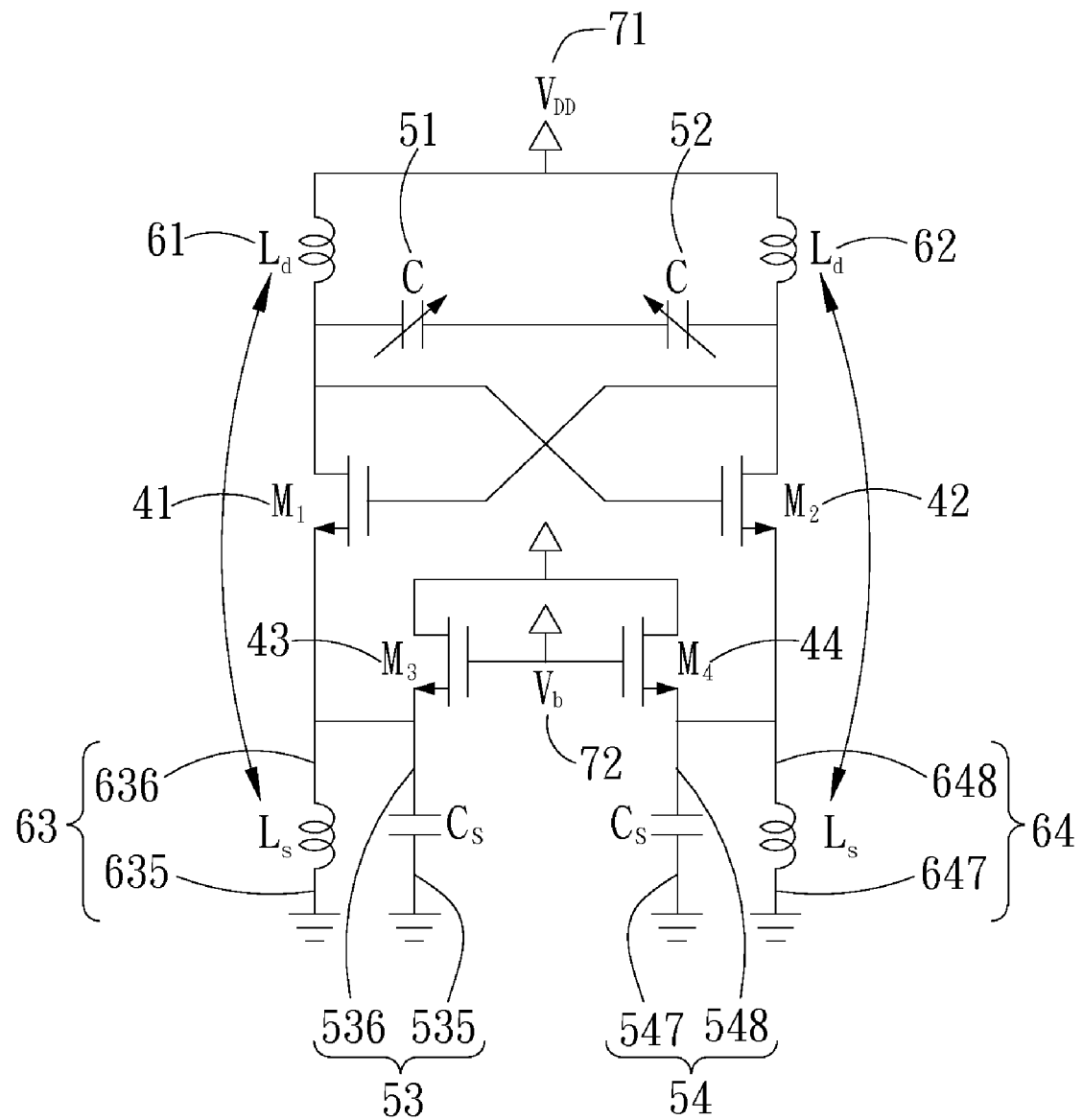
FIG. 5 is a circuit diagram of a transistor voltage-controlled oscillator of a third embodiment according to the present invention.

FIG. 5 is a circuit diagram of a transistor voltage-controlled oscillator of a third embodiment according to the present invention. In the third embodiment, the third source 432 (see earlier labeling) is connected to a third inductive circuit 63 and a third capacitor 53, and the fourth source 422 (see earlier labeling) is connected to a fourth inductive circuit 64 and a fourth capacitor 54. The third inductive circuit 63 includes a fifth inductor end 635 and a sixth inductor end 636. The third capacitor 53 includes a fifth capacitor end 535 and a sixth capacitor end 536. The fourth inductive circuit 64 includes a seventh inductor end 647 and an eighth inductor end 648. The fourth capacitor 54 includes a seventh capacitor end 547 and an eighth capacitor end 548.

The fifth inductor end 635, the fifth capacitor end 535, the seventh inductor end 647 and the seventh capacitor end 547 are all connected to ground. The sixth inductor end 636 and the sixth capacitor end 536 are both connected to the third source 432. The eighth inductor end 648 and the eighth capacitor end 548 are both connected to the fourth source 442. In other words, the third capacitor 53 and the third inductive circuit 63 form an inductor-capacitor tank oscillation structure, and the fourth capacitor 54 and the fourth inductive circuit 64 form another inductor-capacitor tank oscillation structure.

A CMOS in-phase coupled transformer fabrication technique is applied to couple the third inductive circuit 63 in phase with the first inductive circuit 61, and the fourth inductive circuit 64 in phase with the second inductive circuit 62. Through the use of the inductor-capacitor tank in-phase coupling technique, the output frequency of the oscillator is increased dramatically, and the phase noise of the oscillator are reduced accordingly.

In conclusion, the transistor voltage-controlled oscillator of the present invention reduces the parasitic capacitance effect when operating at a high frequency to prevent the decrease of the oscillator frequency of an inductor-capacitor tank transistor oscillation circuit and increase the working frequency of the voltage-controlled circuit.

The foregoing descriptions of the detailed embodiments are illustrated to disclose the features and functions of the present invention and are not to be construed as restrictive of the scope of the present invention. It should be understood to those in the art that various modifications and variations according to the spirit and principle in the disclosure of the present invention should fall within the scope of the appended claims.

What is claimed is:

1. A transistor voltage-controlled oscillator, comprising:
a crossed-coupled inductor-capacitor tank (LC-Tank) transistor voltage-controlled circuit comprising a first transistor having a first gate, a first source and a first drain, and a second transistor having a second gate, a second source and a second drain; and
a transistor frequency multiplying circuit comprising a third transistor having a third gate, a third source and a third drain, and a fourth transistor having a fourth gate, a fourth source and fourth drain;
wherein the third gate is connected to the fourth gate;
wherein the third drain is connected to the fourth drain;
wherein the third source is connected to the first source;
wherein the fourth source is connected to the second source; and
wherein the third gate and the fourth gate are not externally connected to the third drain and the fourth drain, respectively.

2. The transistor voltage-controlled oscillator of claim 1, wherein the first gate is connected to the second drain, and wherein the second gate is connected to the first drain.

3. The transistor voltage-controlled oscillator of claim 1, wherein the third gate and the fourth gate are connected to a modulation voltage source.

4. The transistor voltage-controlled oscillator of claim 1, wherein the crossed-coupled inductor-capacitor tank transistor voltage-controlled circuit further comprises a first varactor, a second varactor, a first inductive circuit and a second inductive circuit, the first varactor having a first capacitor end and a second capacitor end, the second varactor having a third capacitor end and a fourth capacitor end, the first inductive circuit having a first inductor end and a second inductor end, and the second inductive circuit having a third inductor end and a fourth inductor end.

5. The transistor voltage-controlled oscillator of claim 4, wherein the second capacitor end is connected to the third capacitor end, the first capacitor end is connected to the first inductor end, and the fourth capacitor end is connected to the third inductor end.

6. The transistor voltage-controlled oscillator of claim 4, wherein the first drain is connected to the second gate and the first capacitor end, and the second drain is connected to the first gate and the fourth capacitor end.

7. The transistor voltage-controlled oscillator of claim 4, wherein the second inductor end and the fourth inductor end are connected to a working voltage source.

8. The transistor voltage-controlled oscillator of claim 1, wherein the third source is connected to an external current source, and wherein the fourth source is connected to another external current source.

9. The transistor voltage-controlled oscillator of claim 8, wherein the third source is connected to a transmission line with a length equal to one-fourth the wavelength of operation in length, and wherein the fourth source is connected to another transmission line with a length equal to one-fourth the wavelength of operation in length.

10. The transistor voltage-controlled oscillator of claim 1, wherein the third source is connected to a third inductive circuit having a fifth inductor end and a sixth inductor end, and a third capacitor having a fifth capacitor end and a sixth capacitor end, while the fourth source is connected to a fourth inductive circuit having a seventh inductor end and an eighth inductor end, and a fourth capacitor having a seventh capacitor end and an eighth capacitor end.

11. The transistor voltage-controlled oscillator of claim 10, wherein the fifth inductor end, the fifth capacitor end, the seventh inductor end and the seventh capacitor end are grounded.

12. The transistor voltage-controlled oscillator of claim 10, wherein the sixth inductor end and the sixth capacitor end are connected to the third source, and the eighth inductor end and the eighth capacitor end are connected to the fourth source.

13. The transistor voltage-controlled oscillator of claim 10, wherein the third capacitor and the third inductive circuit form an inductor-capacitor tank oscillation structure, and the fourth capacitor and the fourth inductive circuit form another inductor-capacitor tank oscillation structure.

14. The transistor voltage-controlled oscillator of claim 10, wherein the third inductive circuit is coupled in phase with the first inductive circuit, and the fourth inductive circuit is coupled in phase with the second inductive circuit.

15. The transistor voltage-controlled oscillator of claim 14, wherein the third inductive circuit coupled in phase with the first inductive circuit and the fourth inductive circuit coupled in phase with the second inductive circuit utilize a CMOS in-phase coupled transformer fabrication technique.

16. The transistor voltage-controlled oscillator of claim 10, wherein the third source is connected to the third inductive circuit and the third capacitor directly, and the fourth source is connected to the fourth inductive circuit and the fourth capacitor directly.

* * * * *